US006761567B2

(12) United States Patent
Onizuka et al.

(10) Patent No.: US 6,761,567 B2
(45) Date of Patent: Jul. 13, 2004

(54) ELECTRIC POWER DISTRIBUTION UNIT FOR ELECTRIC CONNECTION BOX AND ELECTRIC CONNECTION BOX

(75) Inventors: Takahiro Onizuka, Nagoya (JP); Yukinori Kita, Yokkaichi (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/352,908

(22) Filed: Jan. 29, 2003

(65) Prior Publication Data
US 2003/0157821 A1 Aug. 21, 2003

(30) Foreign Application Priority Data
Jan. 29, 2002 (JP) .................................... 2002-020131

(51) Int. Cl.[7] ............................................ H01R 9/09
(52) U.S. Cl. ................................ 439/76.2; 439/949
(58) Field of Search ............................. 439/590, 76.2, 439/736, 949, 751

(56) References Cited

U.S. PATENT DOCUMENTS

| 6,494,723 B2 | * | 12/2002 | Yamane et al. ............ 439/76.2 |
| 6,503,090 B2 | * | 1/2003 | Onizuka ...................... 439/75 |
| 6,599,136 B2 | * | 7/2003 | Sheldon et al. ............... 439/92 |
| 2001/0028197 A1 | | 10/2001 | Yamane et al. | |

FOREIGN PATENT DOCUMENTS

JP    A 2001-319708    11/2001

* cited by examiner

Primary Examiner—Khiem Nguyen
(74) Attorney, Agent, or Firm—Oliff & Berridge PLC

(57) ABSTRACT

An electric power distribution unit is formed independently of a bus bar board by integrating a plurality of switching devices. The electric power distribution unit includes a heat radiation plate and a plurality of unit-forming bus bars. The switching devices are mounted on the bus bars. Input and output terminals are formed by bending appropriate unit-forming bus bars toward the heat radiation plate, and are connected to connection terminals of the bus bar board. A circuit is formed in which electric power inputted to the input terminal is supplied through the switching devices to the output terminals.

10 Claims, 5 Drawing Sheets

ELECTRIC POWER DISTRIBUTION UNIT FOR ELECTRIC CONNECTION BOX AND ELECTRIC CONNECTION BOX

BACKGROUND OF THE INVENTION

1. Field of Invention

This invention relates to an electric power distribution unit constituting an electric power distribution circuit extending from a vehicle-mounted electric power source in a vehicle, such as an automobile or the like, and an electric connection box having such a unit.

2. Description of Related Art

Heretofore, an electric connection box, in which an electric power distribution circuit is formed by stacking a plurality of bus bar boards, and in which fuses and relay switches are incorporated for distributing electric power from a common vehicle-mounted electric power source to various electronic units, has been generally known.

Further, in order to reduce a size of such an electric connection box and to implement switching control, an electric connection box has been developed recently in which semiconductor switching devices, such as field effect transistors (FETs) or the like, are interposed between input and output terminals in lieu of the relay switches.

However, since these semiconductor switching devices have a relatively great calorific power, it is necessary to efficiently remove heat from the devices.

An electric connection box is disclosed in, for example, Japanese Laid-Open Patent Application No. 2001-319708 as one way for solving this problem. The electric connection box includes an electric power distribution section having an input terminal to be connected to an electric power source, output terminals, semiconductor switching devices interposed between the input and output terminals, and a bus bar circuit section, having a metallic bus bar for forming a circuit and an insulation plate stacked on the bus bar, for connecting the respective output terminals of the electric power distribution section to vehicle-mounted loads. The electric power distribution section and bus bar circuit section are assembled in a common case with some of the bus bars in the bus bar circuit section being connected to the respective output terminals of the electric power distribution section.

In more detail, in the above-described electric connection box, the input terminal bus bar and a plurality of output terminal bus bars are disposed at a rear side of the heat radiation member, semiconductor switching devices are interposed between the input and output terminal bus bars for switching ON-OFF energization between the input and output terminal bus bars, and heat generated from the semiconductor switching devices is radiated through the heat radiation member to the outside. The output terminals of the electric power distribution section extend in a direction parallel to an insulating plate in the bus bar circuit section and are joined to the bus bars by welding or the like with the output terminals being stacked on the bus bars extending from the bus bar circuit section (stacked substantially parallel to an outer wall of the case in the insulating case).

According to such an electric connection box, since the electric power distribution section including the semiconductor switching devices and the heat radiation member is provided independently of the bus bar board as an electric power distribution unit, it is possible to efficiently cool the respective semiconductor switching devices at a single, concentrated position.

SUMMARY OF THE INVENTION

In order to weld output terminals of an electric power distribution unit and bus bars in a bus bar circuit in the above disclosure, a large working space is required between the terminals and the bus bars, and it is necessary to clamp them between welding electrodes at both sides so that they are stacked. Therefore, it is difficult to incorporate the electric power distribution unit in an electric connection box body and to connect the unit to the bus bar circuit afterward. Also, since the output terminals extend from the electric power distribution unit toward the bus bar circuit in a direction parallel to the bus bar board (a direction along an outer wall of a case), at least the projecting portions must be spaced between the electric power distribution unit and the bus bar circuit. This increases the space occupied by the electric connection box.

In view of the above problems, an object of the present invention is to provide an electric power distribution unit that can be easily incorporated in an electric connection box without upsizing the whole electric connection box and to provide an electric connection box that can efficiently cool switching devices while downsizing the electric connection box and simplifying a structure of a bus bar board in connection with providing the electric power distribution unit.

In order to solve the above problems, the present invention is directed to an electric power distribution unit including: a heat radiation member; a plurality of unit-forming bus bars connected to a first surface of the heat radiation member; and switching devices mounted on the unit-forming bus bars. Ends of the unit-forming bus bars extend outwardly from the periphery of the heat radiation member. The extending ends are bent toward the heat radiation member. The bent ends face the bus bars of the bus bar board and are connected to the bus bars to form input terminals and output terminals. Electric power inputted to the input terminals is supplied through the switching devices to the output terminals to form a circuit. The switching devices may be semiconductor switching devices.

A bus bar board including a plurality of bus bars constituting an electric power circuit is accommodated in an insulating case. Ends of given bus bars in the bus bar board stand up on a front side of the insulating case to form connection terminals. An electric power distribution unit is accommodated in the insulating case with the heat radiation member being directed to a front side of the insulating case and the switching devices being directed to a rear side of the insulating case, and the input and output terminals confronting and being connected to the connection terminals.

According to the above construction, since the electric power distribution unit including the switching devices is formed independently of the bus bar board, it is possible to concentratedly cool the switching devices by a common heat radiation member. Accordingly, it is possible to efficiently cool all the respective switching devices while maintaining a small occupied space of the heat radiation member in comparison with a conventional electric power distribution unit in which the switching devices are mounted on the bus bar board in a spread-out manner.

When it is necessary to change the switching devices due to a change of the electrical current to be used, this change can be accomplished simply by exchanging the electric power distribution unit, without changing the bus bar board.

This is superior in general versatility. It is also possible to exchange the electric power distribution unit for a relay block in an existing electric connection box using a relay.

Furthermore, since the ends of the input and output terminal bus bars of the electric power distribution unit are bent toward the heat radiation member to form input and output terminals, it is possible to accommodate the input and output terminals and heat radiation member in the electric connection box so that they are directed to the outside. Because of this, it is possible connect the input and output terminals and the bus bars at the electric connection box body to one another, by welding, for example, while ensuring a good heat radiation function of the heat radiation member and to reduce the occupied space of the whole electric connection box while maintaining a small distance between the electric power distribution unit and the bus bar board. In addition, since the switching devices mounted on the input and output terminal bus bars are directed to a rear surface of the electric connection box, it is possible to effectively protect the switching devices.

It is preferable to incorporate a control circuit board that controls driving of the switching devices in the electric power distribution unit. This makes it possible to accommodate the whole electric power distribution unit in a body of the electric connection box with the control circuit board being electrically connected to the switching devices beforehand. The work of assembling the electric connection box can therefore be dramatically simplified in comparison with a work of assembling the electric power distribution unit and control circuit board individually.

In this case, if the control circuit board is disposed facing the rear surface of the heat radiation member, the control circuit board is necessarily directed to the rear side of the insulating case when the electric power distribution unit is mounted in the insulating case of the electric connection box. This can effectively protect not only the switching devices but also the control circuit board against any objects outside the case.

As a practical structure for electrically interconnecting the control circuit board and the semiconductor switching devices, portions of the unit-forming bas bars to which the switching devices are connected may be bent up to form board connection terminals standing up from the rear surface of the heat radiation member and the control circuit board may be connected to the board connection terminals. According to this structure, it is possible to electrically interconnect the switching devices and the control circuit board by merely bending a part of the unit-forming bus bars.

It is possible to select a suitable configuration and structure of the insulating case. For example, (1) a connector-forming section on which a plurality of connector housings which, along with bus bar ends extending from the bus bar board, constitute connectors that can be connected to external connectors, (2) a unit-mounting section on which the electric power distribution unit is mounted, and (3) a plurality of electrical component-fitting sections that have configurations in which electrical components (e.g., fuse elements) can be fitted and electrically interconnect the electrical components and ends of the bus bars extending from the bus bar board may be arranged parallel to the bus bar board in the insulating case. This will facilitate connections and exchange between an external connector and the bus bar board, between the bus bar board and the electric power distribution unit, and between the bus bar board and the electrical components on the same surface of the insulating case. Since the connector-forming section, unit-mounting section, and electrical component-mounting section are arranged in a direction parallel to the bus bar board, it is possible to connect the respective external connectors, the electric power distribution unit, and the respective electrical components to the common bus bar board at a small distance, thereby enabling the whole electric connection box to be assembled in a compact manner.

Preferably, the electric power distribution unit includes bus bars directly fitted in electrical component terminals for the electrical components to be mounted on the insulating case of the electric connection box. According to this construction, it is possible to directly interconnect suitable unit-forming bus bars of the electric power distribution unit and the electrical components without disposing the bus bar board between them, thereby simplifying a wiring structure.

BRIEF DESCRIPTION OF THE DRAWINGS

The foregoing and other features of the present invention described in or apparent from the following detailed description with reference to the accompanying drawings, wherein.

DETAILED DESCRIPTION OF PREFERRED EMBODIMENTS

Figure 1:
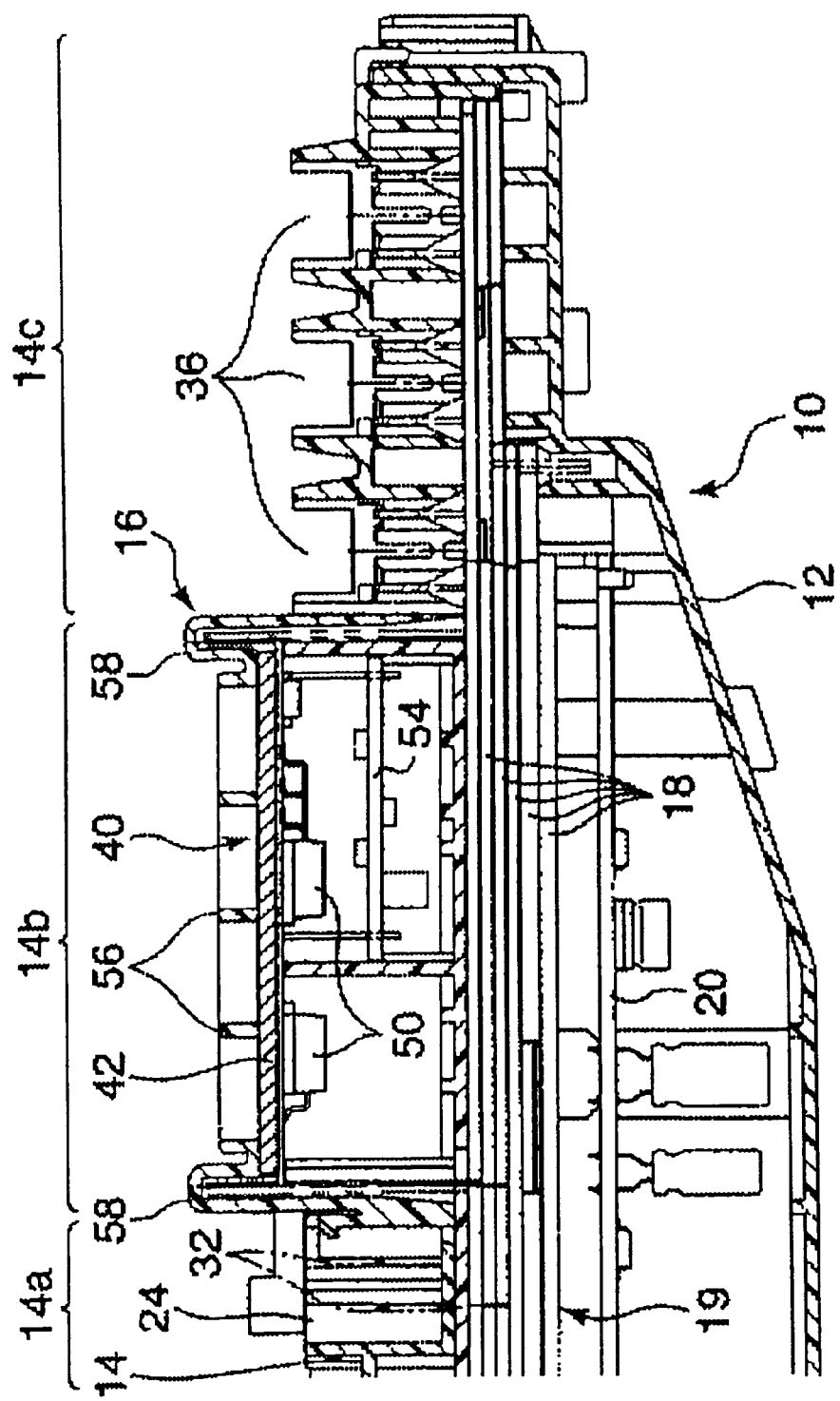
FIG. 1 is a front sectional view of an embodiment of a main part of an electric connection box in accordance with the present invention.

Referring now to the drawings, an exemplary embodiment of an electric connection box in accordance with the present invention will be described below.

Figure 2:
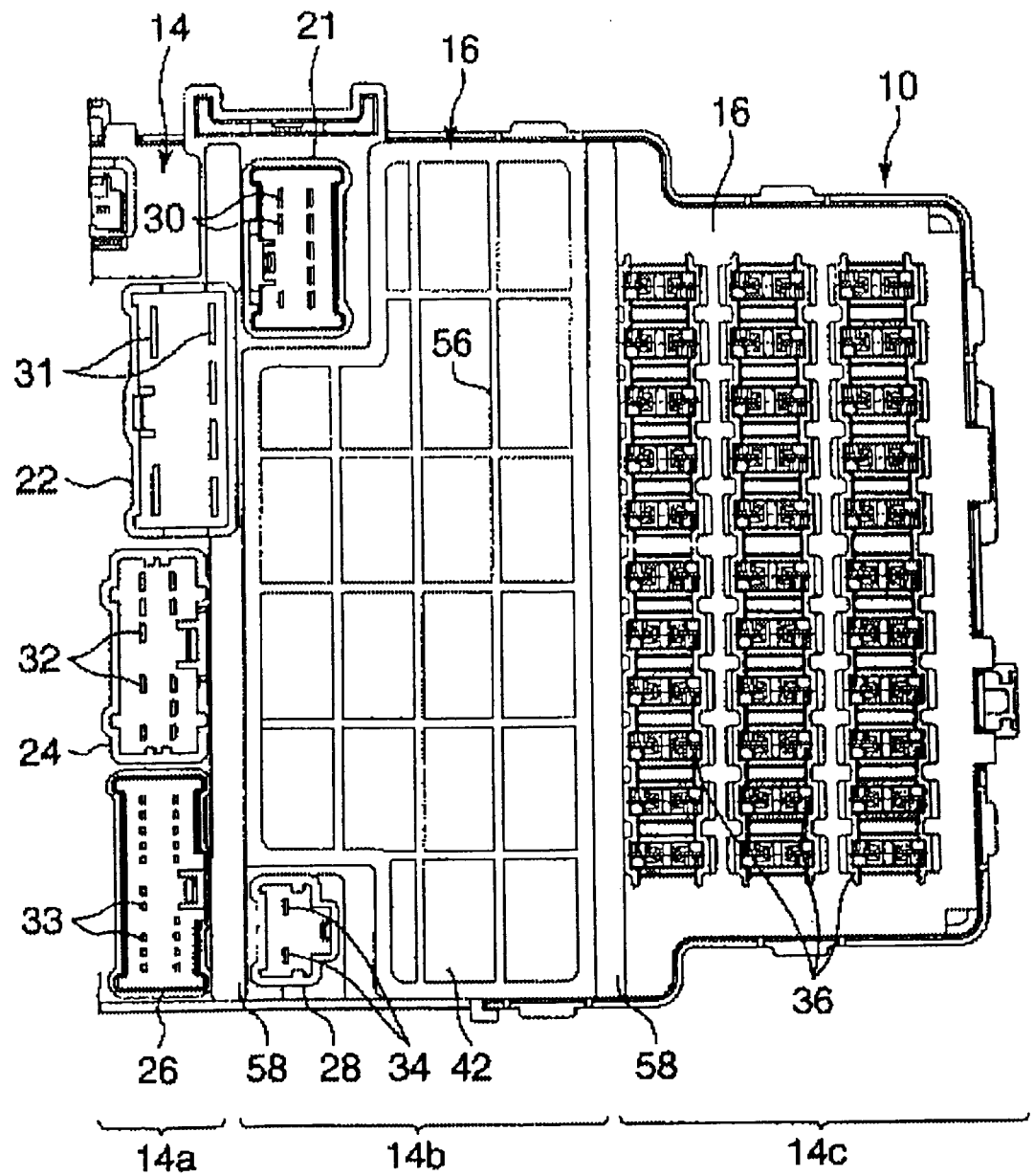
FIG. 2 is a plan view of a main part of the electric connection box shown in FIG. 1.
Figure 3:
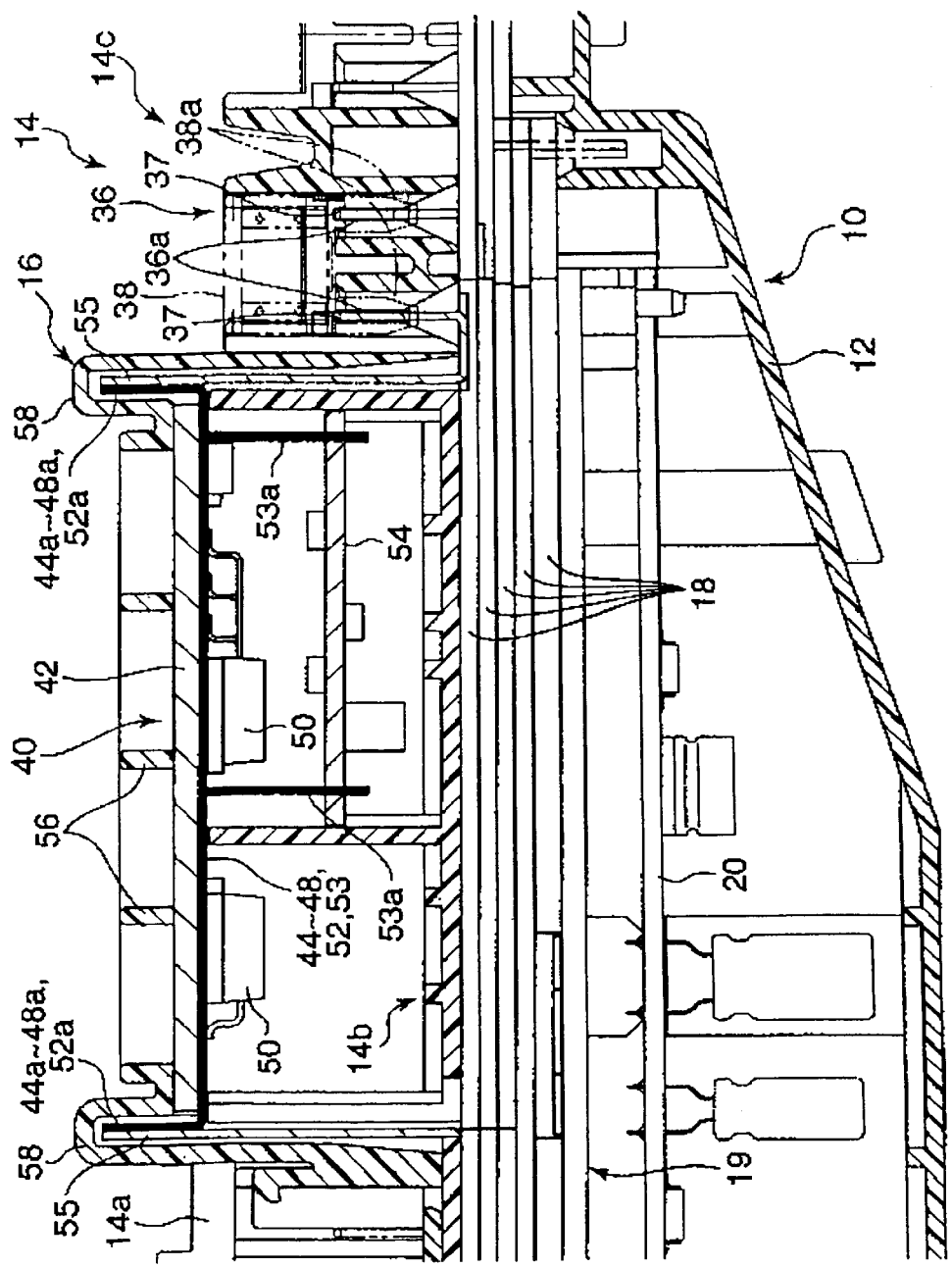
FIG. 3 is a front sectional view of an assembled structure of an electric power distribution unit in the electric connection box shown in FIG. 1.

An electric connection box 10 shown in FIGS. 1 to 3 includes a lower case 12, an upper case 14 stacked on the lower case 12, and a unit cover 16 mounted on the upper case 14. The upper and lower cases 14 and 12 and unit cover 16 may be made of an insulating material, such as a synthetic resin material or the like, to form a case (insulating case) of the present invention.

A bus bar board 19 and a printed circuit board 20 are contained in the insulating case with both boards being stacked. The bus bar board 19 may be formed by stacking a plurality of bus bars and insulating plates one after the other to make an electric power circuit.

As shown in FIGS. 1 and 2, the upper case 14 contains a connector-forming section 14a having a plurality of connector housings 21, 22, 24, 26, and 28, a unit-mounting section 14b including an electric power distribution unit 40 (described in more detail below), and an electrical component-mounting section 14c including a plurality of electrical component fitting portions (e.g., fuse-fitting portions) 36. The sections 14a–14c are arranged in parallel with the bus bar board 19 (horizontally in FIGS. 1 and 2).

As shown in FIG. 2, bus bar ends (tab terminals) 30, 31, 32, 33, and 34 extend inside the respective connector housings 21, 22, 24, 26, and 28 in the connector-forming section 14a. The respective connector housings and their inside bus bar ends constitute connectors that can couple to external connectors. That is, housings of the external connectors (not shown) are fitted in the respective connector housings 21, 22, 24, 26, and 28 while terminals of the external connectors are fitted to the bus bar ends 30, 31, 32, 33, and 34. This enables external circuits (e.g., an electric power source circuit and a load side circuit) and an electric power circuit formed by the bus bar board 19 to be electrically interconnected.

The electrical component-mounting section 14c is provided on the side opposite to the connector-forming section 14a across the unit-mounting section 14b in the illustrated embodiment. Each electrical component-fitting portion 36 in the electrical component-mounting section 14c has a configuration in which an electrical component 38, such as a fuse element, shown by two-dot chain lines in FIG. 3, can be fitted. Each of the electrical components 38 has a pair of electrical component terminals 38a extending downwardly from its body while the respective electrical component-fitting portions 36 have terminal-receiving portions 36a in which the respective electrical component terminals 38a can be inserted. Bus bar ends 37 extend upwardly from the bus bar board 19 in the terminal-receiving portions 36a. The electrical component terminals 38a inserted in the respective terminal-receiving portions 36a engage the bus bar ends 37 and are thereby electrically connected to the bus bar board 19.

Next, an electric power distribution unit for an electric connection box (hereinafter referred to an "electric power distribution unit 40") to be mounted on the unit-mounting section 14b according to an embodiment of this invention will be described with reference to FIGS. 3 to 5.

The electric power distribution unit 40 includes a heat radiation member (heat radiation plate 42 in the illustrated embodiment), a plurality of unit-forming bus bars, a plurality of switching devices, such as semiconductor switching devices, e.g., power MOSFETs (hereinafter referred to "field effect transistor (FET) 50" or "FETs 50"), and a drive control board 54.

The heat radiation plate 42 has a plate-like configuration and may be made of a material with a high heat conductivity (or high specific heat), such as an aluminum alloy or a copper alloy. The heat radiation member 42 is secured to the unit-mounting section 14b so that the top surface (front side surface) of the heat radiation plate 42 is exposed upwardly through the upper case 14 (see FIGS. 1 and 3). The respective unit-forming bus bars may be secured through an adhesive to the rear surface of heat radiation plate 42 (bottom surface of the heat radiation plate 42 in the drawings).

The unit-forming bus bars include a plurality of bus bars 44, 45, 46, 47, and 48, a plurality of output terminal bus bars 52, and a plurality of board connection bus bars 53 and may be arranged as shown in FIG. 3.

The input terminal bus bar 44 includes a drain connection portion 44d, having a relatively wide area on which an FET 50 is mounted, and an input terminal portion 44a extending in a strip-like configuration. Similarly, other input terminal bus bars 45, 46, 47, and 48, each having a relatively wide area, include drain connection portions 45d, 46d, 47d, and 48d, on which one or more FETs 50 (e.g., three FETs 50 in the bus bar 45) are mounted, and input terminal portions 45a, 46a, 47a, and 48a extending from the respective drain connection portions 45d, 46d, 47d, and 48d in strip-like configurations. As shown in FIG. 4, ends of the respective input terminal portions 45a, 46a, 47a, and 48a extend outwardly beyond an end surface of the heat radiation plate 42, and the input terminal bus bars 44 to 48 are disposed so that their ends extend about the same amount. The extending ends of the input terminal portions 44a to 48a are bent toward the heat radiation plate 42 (upper side in FIGS. 3 and 5) to project upwardly beyond a surface of the heat radiation plate 42.

Output terminal bus bars 52 and board connection bus bars 53 are formed into strip-like configurations and arranged in a number corresponding to the number of the FETs 50.

Each of the output terminal bus bars 52 includes a source connection portion 52s at one end and an output terminal portion 52a at the other end. The source connection portion 52s is disposed near a drain connection portion of the input terminal bus bar. As shown in FIG. 4, an end of each output terminal portion 52a extends outwardly beyond an end surface of the heat radiation plate 42 and each output terminal bus bar 52 is disposed so that an amount by which the end extends beyond the end surface of the heat radiation plate 42 is the same as that of each of the input terminal portions 44a to 48a. The projecting portions are bent toward the heat radiation plate 42 (upper side in FIGS. 3 and 5) to project outwardly beyond the surface of the heat radiation plate 42.

Figure 5:
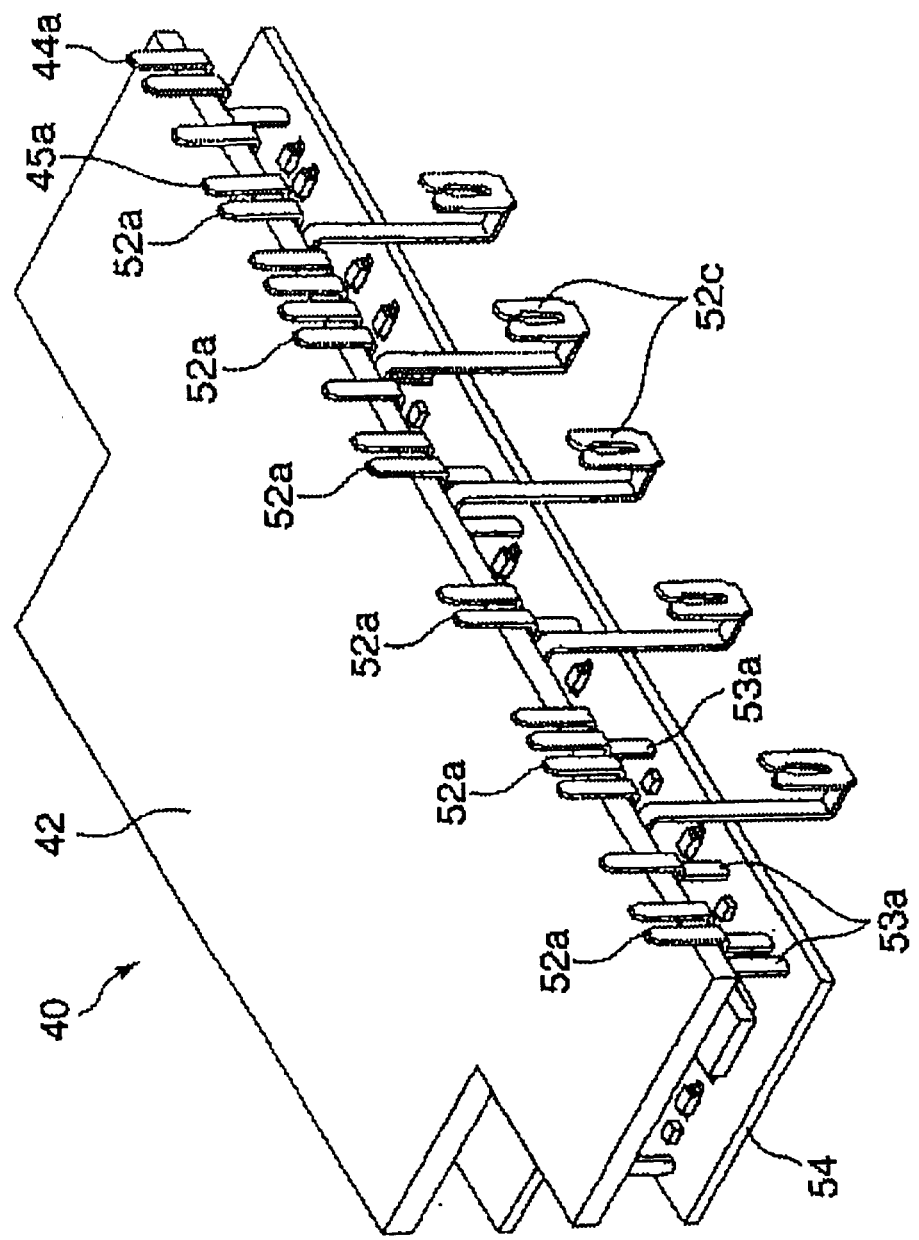
FIG. 5 is a perspective view of the electric power distribution unit of FIG. 3.

As shown in FIG. 5, for some of the output terminal bus bars 52, rather than being bent up to form output terminal portions 52a, the projecting portions are bent downward from the rear surface of the heat radiation plate 42, and distal ends of the projecting portions are bent up to form electrical component connection portions 52c. Each electrical component connection portion 52c is formed into a bifurcated fork-like configuration (to clamp the electrical component terminal 38a) in which the electrical component terminal 38a of the electrical component 38 mentioned above can be forcedly inserted.

Figure 4:
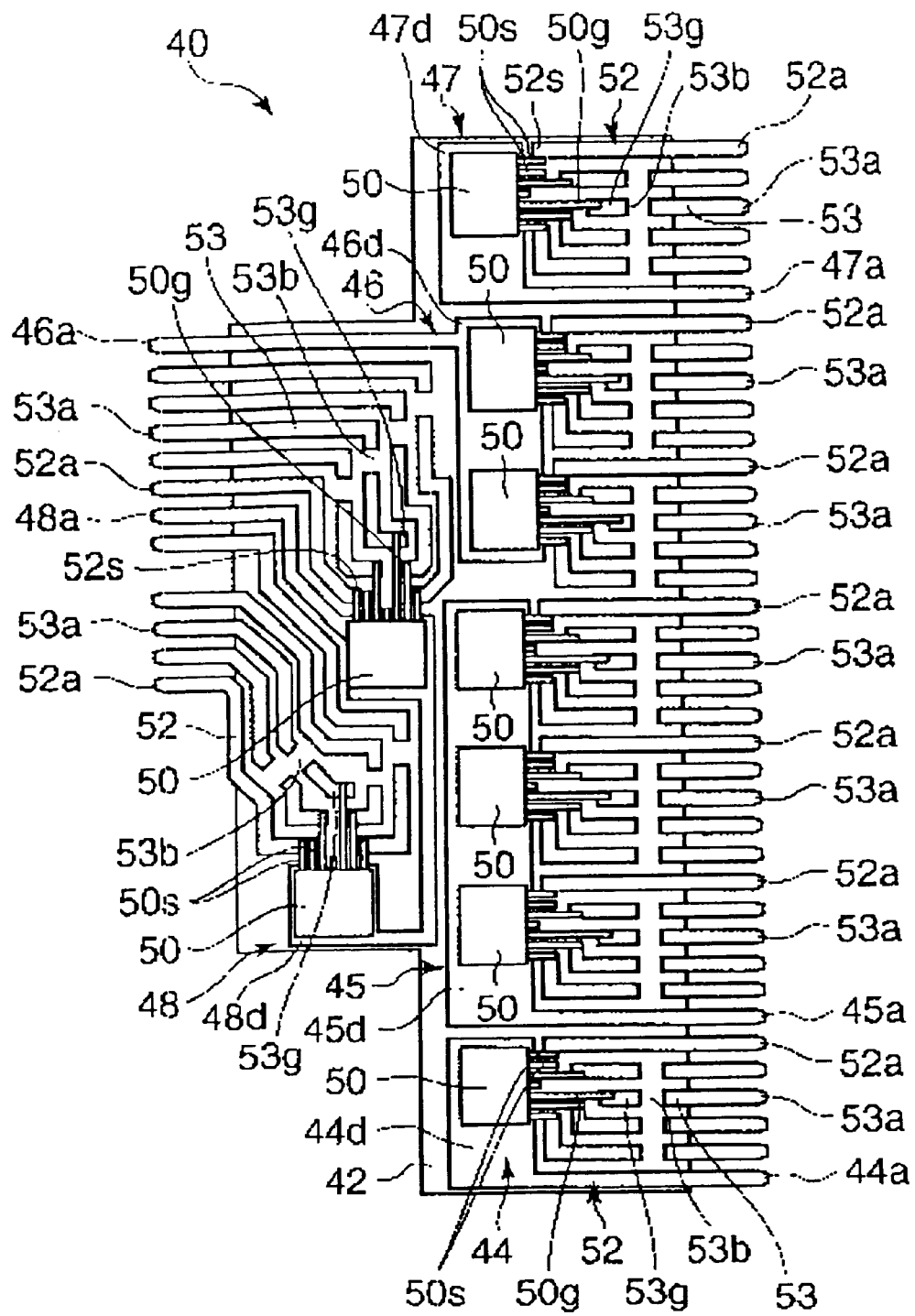
FIG. 4 is a bottom view of bus bars in the electric power distribution unit of FIG. 3, illustrating an arrangement of each bus bar.

As shown in FIG. 4, each board connection bus bar 53 has a gate connection portion 53g at one end and a board connection portion 53a at the other end. The gate connection portion 53g is disposed near the drain connection portion of the corresponding input terminal bus bar. As shown in FIG. 4, an end of each board connection portion 53a extends outwardly beyond the end surface of the heat radiation plate 42, and each board connection bus bar 53 is disposed so that the amount of the end extending beyond the end surface of the heat radiation plate 42 is the same as that of each of the input terminal portions 44a to 48a and output terminal portions 52a. The projecting portion of each board connection portion 53a is bent so as to face away from the heat radiation plate 42 to stand up from the rear surface of the heat radiation plate 42.

The board connection bus bars 53 are separated at an intermediate portion and an FET protection element (not shown; e.g., a diode or a resistance) is bridged across each separated portion 53b.

Although the input terminal bus bars 44 to 48 and output terminal bus bars 52 are made of a single metallic plate in this embodiment, they may be made of a plurality of metallic plates as needed according to their arrangement, and the plurality of metallic plates may be connected to one another by jump lines or directly by welding, soldering or the like.

Each FET 50 may include a substantially rectangular parallelepiped body, and a source terminal 50s and a gate terminal 50g provided on a sidewall of the body.

A drain of each FET 50 is exposed on a rear surface of an FET body. The body of the FETs 50 are each mounted on one of the drain connection portions 44d to 48d of the respective input terminal bus bars 44 to 48 by soldering or the like, thereby electrically connecting the drain of each FET 50 to the drain connection portions 44d to 48d. The source terminal 50s of each FET 50 is mounted on the source connection portion 52s of the corresponding output terminal bus bar 52 by, for example, soldering or the like, and the gate terminal 50g of each FET 50 is mounted on the gate connection portion 53s of the corresponding board connection bus bar 53 by, for example, soldering or the like.

Regarding the switching devices in the present invention, it is possible to use various kinds of semiconductor devices or other devices having a switching function, such as transistors (e.g., an insulated gate bipolar transistor (IGBT) or an ordinary bipolar transistor), gate turn-off thyristors (GTOs), or various other kinds of thyristors as well as metal-oxide semiconductor field effect transistors (MOSFETs) in accordance with the particular design parameters and requirements. Such switching devices may be devices on which are mounted, for example, semiconductor chips, or package devices. The illustrated FETs 50 include an electric power source terminal for control and a ground terminal in addition to the source terminal 50s and gate terminal 50g. The unit-forming bus bars are added to the FETs 50 in connection with the electric power source and ground terminals.

Any suitable method may be used for interconnecting the switching devices and the respective terminals. For example, wire bonding may be used. It is also possible to select the number and arrangement of the switching devices and output terminals in accordance with the number and arrangement of respective electrical devices in a vehicle.

The control circuit board 54 includes a control circuit for controlling a drive of each FET 50, for example, a printed circuit board. The control circuit board 54 may be provided at any suitable portions with through-holes into which the board connection portions 53a of the respective board connection bus bars 53 are inserted and secured by soldering or the like (see FIG. 3). Consequently, the gate terminals of the respective FETs 50 are electrically connected through the board connection bus bars 53 to the control circuit of the control circuit board 54, and the control circuit board 54 is disposed facing the rear surface of the heat radiation plate 42.

An assembled structure of this electric power distribution unit 40 is shown in FIG. 3.

As shown in FIGS. 1 and 3, the electric power distribution unit 40 is fitted in the unit-mounting section 14b with an outward-facing surface being directed toward a front side (upper side in FIG. 3), and an inward-facing surface, on which the unit-forming bus bars 44 to 48, 52, 53, and the FETs 50 are fixed, being directed toward a rear side (lower side in FIG. 3). The respective input terminal portions 44a to 48a and output terminal portions 52a extending upwardly from the end surface of the heat radiation plate 42 face the connection terminals 55 extending upwardly from the end surface of the bus bar board 19 (standing up towards the outer surface of the case). The electrical component connection sections 52c (FIG. 5) formed on some of the output terminal bus bars 52 are inserted upwardly into the bottom of appropriate electrical component-fitting portions 36 to be directly connected to the electrical component terminals 38a of the electrical components 38 fitted in the electrical component-fitting portions 36.

Furthermore, the unit cover 16 is mounted on the upper case 14 so that the unit cover 16 covers the electric power distribution unit 40. The unit cover 16 includes heat radiation plate protection sections 56 and connection portion protection sections 58. The heat radiation plate protection sections 56 may be formed into a grid-like configuration. An upper surface of the heat radiation plate 42 is exposed through apertures in the grid to the outside of the case. The connection portion protection sections 58 have a configuration that covers over an interconnecting part (joining part) between the input terminal portions 44a to 48a, output terminal portions 52a and the connection terminals 55 extending upwardly from the bus bar board 19.

The unit cover 16 may be omitted, and the whole surface of the heat radiation plate 42 may be exposed to the outside of the case. It is possible in this case to enhance a cooling function of the plate 42 by including a plurality of projecting fins on a front side surface of the plate 42.

Next, an operation of the electric connection box will be explained.

Electric power supplied from a vehicle-mounted battery (not shown) is inputted to the bus bar board 19 through an external connector coupled to an appropriate connector housing (for example, a connector housing 22) formed in the upper case 14. This electric power is supplied from an appropriate connection terminal 52 of the bus bar board 19 through input terminal bus bars 44 to 48, of which the input terminal portions 44a to 48a are connected to the connection terminal 55, to the drains of the FETs 50 mounted on the drain connection portions 44d to 48d of the input terminal bus bars 44 to 48.

When the FETs 50 are placed in an ON state, the electric power inputted to the drain is supplied through the output terminal bus bars 52 and the connection terminals 55 facing and connected to the output terminal portions 52a into the bus bar board 19. This electric power is supplied through the tab terminals (e.g., tab terminals 32) of the bus bar board 19 from an external connector (not shown) coupled to a suitable connector housing (for example, the connector housing 24) of the upper case 14 to given electric loads (for example, vehicle-mounted electric equipment). The electric power is directly supplied through the electrical component connection portions 52c to some of the output terminal bus bars 52 (the output terminal bus bars 52 having the electrical component connection portions 52c).

In contrast, when the FETs 50 are placed in an OFF state, even if electric power is inputted in the drain, the electric power is not transmitted to the output terminal bus bars 52. That is, the electric power distribution circuit is cut off.

The control circuit assembled in the control circuit board 54 controls such ON-OFF operation of the FET 50. In more detail, an operation signal (for example, a switch signal) transmitted from a circuit outside the electric connection box is inputted through appropriate bus bars (not shown) of the bus bar 19 into the control circuit of the control circuit board 54. In response to the operation signal, the control circuit sends a control signal through the board connection bus bar 53 to the gate terminal 50g of the appropriate FET 50, thereby controlling an ON-OFF switching operation of energization between the drain and source of the FET 50.

In the above-described electric power distribution unit for the electric connection box, since the conventional mechanical relay switch incorporated in the bus bar circuit is replaced with the FETs 50 and since these FETs 50 are arranged independently and concentratedly as the electric power distribution unit 40, it is possible to dramatically simplify and downsize a structure of the bus bar board 19, thereby making the whole electric, connection box compact.

The electric connection box according to this embodiment can obtain the following effects.

Since the respective FETs 50 are directly mounted on the unit-forming bus bars, these unit-forming bus bars are fixed on the common heat radiation plate 42, and since the front side surface of the heat radiation plate 42 is exposed outside the case, it is possible to efficiently cool all the respective FETs 50.

When it is necessary to change the FETs 50 due to a change of the electrical current to be used, this change can be accomplished simply by exchanging the electric power distribution unit 40, without changing the bus bar board. This is superior in general versatility. It is also possible to replace the electric power distribution unit 40 with a relay block in an existing electric connection box using a relay.

Since the input terminal portions 44a to 48a of input terminal bus bars 44 to 48 and the output terminal portions 52a of the output terminal bus bars 52 are bent toward the heat radiation plate 42 to form the input and output terminals, it is possible to incorporate the input and output terminals and heat radiation plate 42 in the electric connection box 10 with the terminals and member directed to the outside, thereby facilitating assembly of the electric power distribution unit 40 in the box from the outside of the case while ensuring a good heat radiation of the heat radiation plate 42. In more detail, since the input terminal portions 44a to 48a and the output terminal portions 52a and the connection portions 55 of the bus bar board 19 face each other and extend outwardly from the case, it is possible to easily connect the facing portions by clamping them by welding electrodes to weld them at the outside of the case.

Since the input terminal portions 44a to 48a, the output terminal portions 52a, and the connection terminals 55 of the bus bar board 19 are connected to one another so that they extend out of the case and face one another, it is possible to reduce the space occupied by the whole electric connection box without providing a great distance between the electric power distribution unit and the bus bar unit, as compared with the electric power distribution unit disclosed in Japanese Laid-Open Patent Application No. 2001-319708 mentioned above, which is an electric power distribution unit in which output terminals extend toward a bus bar board in parallel with an outer wall of a case.

Since the FETs 50 and control circuit board 54 are necessarily hidden behind the upper case 14, it is possible to effectively protect these FETs 50 and control circuit board 54 from the outside of the case.

Since the electric power distribution unit 40 is incorporated in the electric connection box 10 with the control circuit board 54 being incorporated in the electric power distribution unit 40 beforehand, the work of assembling the electric connection box can be dramatically simplified in comparison with the work of assembling the electric power distribution unit 40 and the control circuit board 54 individually.

Since the connector-forming section 14a, unit-mounting section 14b, and electrical component-mounting section 14c are arranged on the upper case 14 parallel to the bus bar board 19, it is possible to connect an external connector, the electric power distribution unit 40, and respective electrical components 38 to the common bus bar board 19 at a short distance, thereby assembling the whole electric connection box in a compact manner.

Since some of the output terminal bus bars 52 include the electrical component connection bus bars having the electrical component connection portions 52c directly fitted to the electrical component terminals 38a of the electrical components 38 mounted on the upper case 14, it is possible to electrically interconnect the output terminal bus bars 52 and the electrical components 38 without disposing the bus bar board 19 between them, thereby further simplifying a wiring structure.

It is possible to select any method and/or material for securing the unit-forming bus bars to the rear surface of the heat radiation plate 42 via the insulating layer. For example, an insulation sheet made of a silicone resin or the like may be adhered to the rear surface of the heat radiation plate 42 and the unit-forming bus bars may be secured on the insulation sheet. An adhesive having good electrical insulation and heat conductivity may be applied on the rear surface of the heat radiation plate 42 and the unit-forming bus bars may be adhered on the rear surface.

According to the present invention, since the electric power distribution unit 40 including the switching devices, such as semiconductor switching devices, is formed independently of the bus bar board 19, it is possible to efficiently cool the switching devices while maintaining the heat radiation plate 42 in a small space and to easily exchange the switching devices without changing a design of the bus bar board 19.

Furthermore, since the ends of the input and output terminal bus bars of the electric power distribution unit 40 are bent toward the heat radiation member to form input and output terminals, and since the input and output terminals and the heat radiation plate 42 are incorporated in the electric connection box 10 such that they are directed to the outside, it is possible to connect the input and output terminals and the bus bars at the electric connection box body to one another by welding, for example, while ensuring a good heat radiation function of the heat radiation member, and to reduce the space occupied by the whole electric connection box while maintaining a small distance between the electric power distribution unit 40 and the bus bar board 19. In addition, since the switching devices mounted on the input and output terminal bus bars such that the input and output bus bars are directed to the outside are hidden within the electric connection box, it is possible to effectively protect the switching devices.

While the invention has been described in conjunction with the specific embodiments described above, many equivalent alternatives, modifications and variations may become apparent to those skilled in the art when given this disclosure. Accordingly, the exemplary embodiments of the invention as set forth above are considered to be illustrative and not limiting. Various changes to the described embodiments may be made without departing from the spirit and scope of the invention.

What is claimed is:

1. An electric power distribution unit, comprising:
   a heat radiation member;
   a plurality of unit-forming bus bars connected to a first surface of said heat radiation member; and
   a plurality of switching devices mounted on said unit-forming bus bars; wherein
   ends of said unit-forming bus bars extend outwardly from a periphery of said heat radiation member, said extending ends being bent toward said heat radiation member;
   said bent ends face said bus bars of said bus bar board and are connected to said bus bars to form input terminals and output terminals; and
   electric power inputted to said input terminals is supplied through said switching devices to said output terminals to form a circuit.

2. An electric power distribution unit according to claim 1, wherein a control circuit board that controls driving of said switching devices is disposed facing the first surface of said heat radiation member.

3. An electric power distribution unit according to claim 2, wherein portions of said unit-forming bus bars to which said switching devices are connected are bent up to form board connection terminals standing up from the first surface of said heat radiation member, and said control circuit board is connected to said board connection terminals.

4. An electric connection box, comprising:

an insulating case;

a bus bar board including a plurality of bus bars constituting an electric power circuit accommodated in said insulating case, ends of given bus bars in said bus bar board standing up on a front side of said insulating case to form connection terminals; and an electric power distribution unit according to claim 1 accommodated in said insulating case with said heat radiation member being directed to a front side and said switching devices being directed to a rear side, and said input and output terminals facing and connected to said connection terminals.

5. An electric connection box, comprising:

an insulating case;

a bus bar board including a plurality of bus bars constituting an electric power circuit accommodated in said insulating case, ends of given bus bars in said bus bar board standing up on a front side of said insulating case to form connection terminals; and an electric power distribution unit according to claim 2 accommodated in said insulating case with said heat radiation member being directed to a front side and said switching devices being directed to a rear side, and said respective input and output terminals of said unit being confronted to and connected to said connection terminals.

6. An electric connection box according to claim 4, wherein (i) a connector-forming section on which a plurality of connector housings each constituting a connector that can be connected to an external connector along with bus bar ends extending from said bus bar board, (ii) a unit-mounting section on which said electric power distribution unit is mounted, and (iii) a plurality of electrical component-fitting portions that have configurations in which electrical components can be fitted and electrically interconnect said electrical components and ends of said bus bars extending from said bus bar board are arranged in parallel with said bus bar board in said insulating case.

7. An electric connection box according to claim 6, wherein said electric power distribution unit includes bus bars directly fitted in said electrical component terminals of said electrical components to be mounted on said insulating case of said electric connection box.

8. An electric connection box according to claim 4, wherein said output terminal bus bars include bus bars having electrical component-fitting portions directly fitted in electrical component terminals of electrical components attached to said insulating case of said electric connection box.

9. An electric connection box according to claim 4, wherein said electrical components are fuse elements.

10. An electric connection box according to claim 1, wherein said plurality of switching devices are a plurality of semiconductor switching devices.

* * * * *